US008981213B1

(12) United States Patent
Micallef

(10) Patent No.: US 8,981,213 B1
(45) Date of Patent: Mar. 17, 2015

(54) PIEZOELECTRIC ULTRACAPACITIVE PHOTOVOLTAIC CELL

(76) Inventor: Joseph A. Micallef, Chevy Chase, MD (US)

( * ) Notice: Subject to any disclaimer, the term of this patent is extended or adjusted under 35 U.S.C. 154(b) by 1078 days.

(21) Appl. No.: 12/469,602

(22) Filed: May 20, 2009

(51) Int. Cl.
*H01L 41/00* (2013.01)
*H01L 31/00* (2006.01)
*H02N 6/00* (2006.01)
*H01L 31/042* (2014.01)

(52) U.S. Cl.
USPC ........... 136/263; 136/243; 136/252; 136/244; 310/311

(58) Field of Classification Search
USPC ................. 310/311; 136/243, 252, 263, 244
See application file for complete search history.

(56) References Cited

U.S. PATENT DOCUMENTS

| | | | | |
|---|---|---|---|---|
| 3,585,416 | A | * | 6/1971 | Mellen ........................ 310/311 |
| 4,585,581 | A | * | 4/1986 | Skotheim ................ 252/519.21 |
| 5,500,635 | A | * | 3/1996 | Mott ........................ 340/323 R |
| 6,291,763 | B1 | * | 9/2001 | Nakamura .................... 136/256 |
| 2005/0199280 | A1 | * | 9/2005 | Royer ........................... 136/255 |
| 2007/0284887 | A1 | * | 12/2007 | Lee .............................. 290/1 R |
| 2008/0173345 | A1 | * | 7/2008 | Cochran et al. .............. 136/248 |
| 2009/0295257 | A1 | * | 12/2009 | Wang et al. ................... 310/367 |

FOREIGN PATENT DOCUMENTS

DE 19831692 * 1/2000 ........... H01L 31/042

OTHER PUBLICATIONS

Xu et al "Nanowire Structured Hybrid Cell for Concurrently Scavenging Solar and Mechanical Energies", Journal of the American Chemical Society, Apr. 1, 2009 pp. 5866-5872, vol. 131, Issue 16.*
Drayton et al "Piezo-Photovoltaic Effect in Thin-Film CDS/CDTE Solar Cells", Photovoltaic Energy Conversion, Conference Record of the 2006 IEEE 4th World Conference on May 7-12, 2006, Jan. 15, 2007 pp. 491-494.*
Michael Gratzel, "Dye-Sensitized Solar Cells", Journal of Photochemistry and Photobiology C: Photochemistry Reviews, vol. 4 Issue 21, Oct. 31, 2003 pp. 145-153.*
Richard J. Lewis, Sr. "Hawley's Condensed Chemical Dictionary, 12th Edition", John Wiley & Sons, Inc., New York p. 1028 (1993).*
Cooray et al "Piezo-Photovoltaic Device Operations", Photovoltaic Specialists Conference, 2008. PVSC '08. 33rd IEEE , May 11-16, 2008, San Diego, California, pp. 1-3.*
Mitra et al, "Piezo-photovoltaic coupling in CdS-based thin-film photovoltaics", Journal of Applied Physcis, Columes 102, 034505, 2007 pp. 034505-1-034505-17.*

* cited by examiner

*Primary Examiner* — Alexander Kollias

(57) ABSTRACT

A piezoelectric photovoltaic cell is disclosed. The cell may include a photovoltaic portion, including a sensitized semiconductor material. The cell may also include a piezoelectric portion, including a piezoelectric material.

16 Claims, 2 Drawing Sheets

PIEZOELECTRIC ULTRACAPACITIVE PHOTOVOLTAIC CELL

BACKGROUND OF THE INVENTION

The generation of energy in a clean, renewable and readily available manner is a substantial concern to governments, individuals and research bodies around the world because of the difficulty in securing sufficient fuels to meet rising energy demand and the many environmental hazards associated with the generation of power and the acquisition of fuel stocks. One need only consider the Middle East or the tailpipe of an automobile to begin to appreciate the problems involved with the current approach to energy generation.

Solar energy has for decades been of great interest to scientists and politicians in search of a clean, safe energy supply. It has been estimated that the energy supplied by the Sun to the Earth each year is approximately $3 \times 10^{24}$ joules of energy, or 10,000 times more than humanity's current energy use. The ability to harness just a fraction of that energy would create a sea-change in our energy markets and our environmental outlook.

Solar power, however, has not proved the panacea it perhaps at first appeared. Beginning with the Shockley-Queisser limit, first calculated in 1961, scientists have found that the Sun gives up her energy to man—at least for conversion to electricity—rather stubbornly. The history of solar energy is one of expensive manufacturing techniques and low quantum efficiency. Some impressive innovations have occurred though. Professor Gratzel's 1990 dye-sensitized solar cell, for example, showed that the conversion of solar energy to electrical energy could at least be done using inexpensive materials and safe manufacturing processes, albeit at relatively small quantum efficiencies.

There is still, however, a significant need for innovations that improve upon the current techniques used to convert sunlight to electricity. Most efforts directed to developing such innovations have so far been directed toward investigating new materials or manufacturing techniques that would increase the quantum efficiency of solar cells. But these have experienced only limited success, and in any event have heretofore resulted in the use of costly, exotic materials, raising their own environmental concerns, and that are unlikely to improve significantly upon the price per watt of current solar cells or be capable of mass commercialization. While such research may eventually result in useful advances, new directions of innovation are needed.

SUMMARY OF THE INVENTION

The current invention takes the task of energy generation in such a new direction by combining third generation photovoltaic cell techniques with piezoelectric ultracapacitive technology. Such technology is disclosed in co-pending applications bearing Ser. No. 12/061,749, filed Apr. 26, 2008, now U.S. Pat. No. 7,859,171, and Ser. No. 11/849,326, filed Sep. 3, 2007, now U.S. Pat. No. 7,755,257, both of which are by the present inventor. The entirety of each of these applications is incorporated herein by reference for all purposes. As described in those applications, a piezoelectric ultracapacitor, or PUC, is capable of generating a voltage and concomitant electric current by capturing the piezoelectric voltages, whether random or intentionally applied. As shown herein, PUC technology can be employed in the context of solar cells, including various kinds of late generation photovoltaic cells, to increase the power generation over and above what the photovoltaic cell would otherwise produce while still maintaining low cost and environmentally friendly manufacturing.

DETAILED DESCRIPTION

Figure 1:
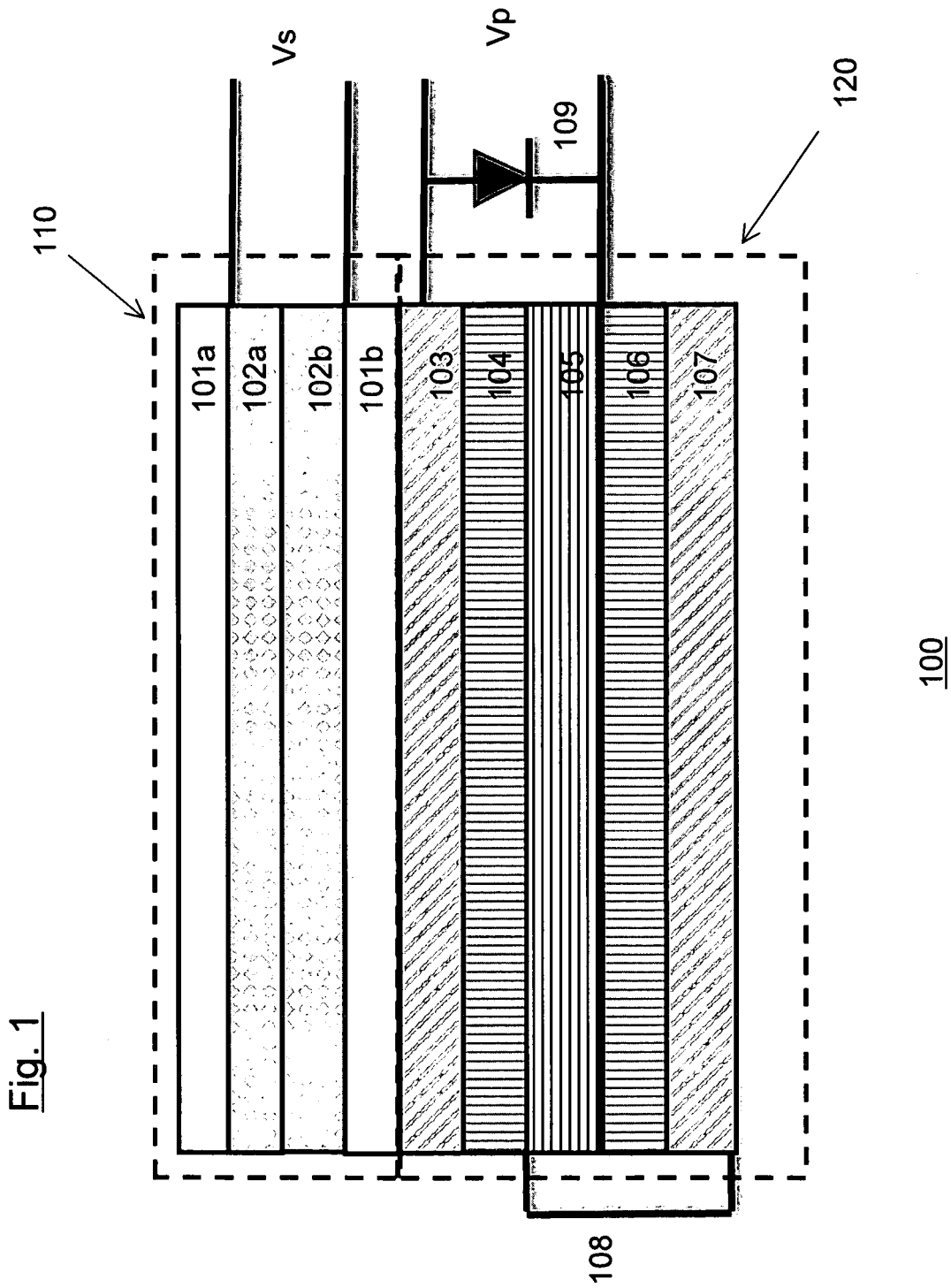
FIG. 1 depicts a first embodiment of a piezoelectric ultracapacitive photovoltaic cell employing the principles of the present invention.

Referring to FIG. 1, there is depicted a first example of a piezoelectric ultracapacitive photovoltaic cell 100 employing the principles of the present invention. This embodiment is shown in FIG. 1 as comprising solar cell portion 110 and piezoelectric ultracapacitor portion 120, both of which are delineated by dotted lines for ease of explanation.

Solar cell portion 110 is a photovoltaic device capable of converting light to electric current, and in this example includes top electrode 101a which is both transparent and conductive. (It will be understood by those of ordinary skill in the art that the term "transparent" in this context is not limited to perfectly transparent electrodes but extends instead to electrodes made of materials that pass a useable amount of light.) Such electrodes are well known in the art and may comprise, for example, a glass plate having disposed on one side a conductive coating such as indium tin oxide (ITO) or a flourine-doped tin oxide. Flexible materials may also be used instead of glass as the substrate for the top electrode, as is known in the art, including polyethylene terephthalates (PETs), polyimides, polyethylene naphthalates (PENs), polymeric hydrocarbons, cellulosics, or combinations of these materials. Other conductive coatings may also be used, such as tin oxides, zinc oxides or a transparent conductive polymer such as poly(3,4-ethylenedioxythiophene), also known as PEDOT. Non-transparent electrodes may also be used, so long as they are configured to permit at least some portion of light to pass through. For example, a conductive mesh, or grid, made of a conductive material such as gold, copper or aluminum, may instead be employed as a top electrode.

Solar cell portion 110 also includes, in this example, bottom electrode 101b, which may comprise the same material as top electrode 101a, though it need not. Other materials, including non-transparent materials may also be used, such as aluminum, copper, gold, platinum or a conductive polymer. Such materials may be in the form of a metallic grid or foil or the like. Bottom electrode 101b may also include a catalyst layer, such as graphite, platinum or nickel. Electrodes 101a and 101b conduct electrical current to and from the cell 100. Bottom electrode 101b is optional, however, because electrode 103 (described below) can serve a similar purpose.

Solar cell portion 110 of cell 100 also includes a semiconductor layer 102a coupled to electrodes 101a and 101b, though additional layers may be coupled to layer 102a just as additional layers may be inserted elsewhere into cell 100. Layer 102a may comprise, for example, any of various semiconductor materials, as is known in the field of conventional solar cells. Such suitable materials include, but are not limited to, sulfides, selenides, tellurides, and oxides of titanium, zirconium, lanthanum, niobium, tin, tantalum, terbium, and tungsten, and combinations of these materials. In this example, layer 102a comprises nanocrystalline titanium dioxide prepared in a manner conventional for use in a dye sensitized solar cell. For example, layer 102a may be prepared by the incremental addition of 20 mL of nitric or acetic acid solution (pH 3-4, in deionized water) to 12 g of colloidal $TiO_2$ powder (Degussa P25) in a mortar while grinding with a pestle, with each 1-mL addition of the acid solution added only after the previous mixing and grinding has produced a uniform lump paste. The paste may then be deposited on electrode 101a in any of several ways, including doctor blade, screen printing, atomizer or immersion, and sintered. As an alternative to sintering, however, other processes may be used, such as low temperature annealing or compression.

Layer 102a, in this example, is then impregnated with a photosensitive material or dye, such as a ruthenium-polypyridine dye, an iron dye, a porphyrrin dye, a dye made from an indole derivative, or a phthalocyanine or even a dye made from simpler materials such as anthocyanins, carotenoids, and chlorophylls, including the juice of simple fruits such a blueberries and blackberries. Various suitable ruthenium and iron dyes are commercially available from Solaronix SA of Aubonne, Switzerland.

In some alternative embodiments, the top electrode may comprise a conductive mesh at least substantially enveloped in the semiconductor layer. That is, the device may be manufactured by coating the mesh in the semiconductor material, finishing the semiconductor through for example sintering, and then sensitizing the semiconductor as described above. A non-conductive transparent material may also be used above the semiconductor to protect the device. It has been found that such embodiments provide good output at very low cost of materials.

Though not necessary to the invention, the example of FIG. 1 employs a dye sensitized type of solar cell portion. Semiconductor layer 102a therefore also includes an electrolyte layer 102b between layer 102a and layer 101b, as is known. Electrolyte layer 102b may comprise any of a number of electrolyte materials such as, for example, an iodide electrolyte solution, a lithium-based electrolyte such as a solution of ethanol, LiCl and TiO2, an ionic liquid, polyvinyl alcohol mixed with a acid, such as acetic, boric, or other acid and, perhaps, a salt such as LiCl, or any other an organic or inorganic electrolyte, any of which may be in a gelled, liquid or solid form. In some embodiments, layer 102b may also comprise a "carrier" material such as a felt or paper to hold the electrolyte in place. Various suitable iodide electrolytes and suitable ionic liquids comprising organic iodide salts are commercially available from Solaronix SA of Aubonne, Switzerland.

In some embodiments, instead of an electrolyte, layer 102b may alternatively comprise a p-type semiconductor material. For example, layer 102b may comprise cuprous oxide or cupric oxide, or a mixture of the two. Also alternatively, layer 102b may comprise a conductive polymer having an appropriate conductivity, including for example PPV, MEH-PPV, PEDOT, or a conductive polymer blended with fullerene or its functional derivatives, as is known in the art.

An output Vs of solar cell portion 110 can be taken across electrodes 101a and 101b. As described in more detail below, the cell of FIG. 1 also includes an output Vp from piezoelectric ultracapacitor portion 120. In any given embodiment, either or both of these outputs may be employed.

Except as described in more detail below, the operation of solar cell portion 110 is similar to that of many conventional solar cells. Light passes through top electrode 101a and is absorbed by semiconductor layer 102, promoting at least some electrons in layer 102 to a higher energy state. The electrons diffuse to one of the electrodes 101a or 101b, depending on the exact configuration of the semiconductor layer and, thereby travel through the electrode to an external circuit, not shown. Electrons return to the cell through the opposite electrode, either 101a or 101b. Thus, an output of solar cell portion 110 can be taken across electrodes 101a and 101b of solar cell portion 110 of the cell 100.

In the context of the present invention, however, solar cell portion 110 interacts with piezoelectric ultracapacitor portion 120, as described below, thereby increasing the efficiency of both portions. Accordingly, piezoelectric ultracapacitor portion 120 will now be described, though additional description appears in the above-referenced patent applications, all of which are incorporated herein, in their entirety, for the purpose of providing such additional details to the reader.

In the example of FIG. 1, piezoelectric ultracapacitor portion 120 includes conductive layer 103, which may comprise for example a conductive foil or grid (or mesh), or a combination thereof. Layer 103 may comprise any conductive material, including, for example, the metals and conductive polymers mentioned above. Piezoelectric ultracapacitor portion 120 also includes conductive layer 107, which may comprise any of the materials that may be used for layer 103, though layers 103 and 107 need not comprise the same material in any given embodiment. In one embodiment, both layers 103 and 107 comprise an aluminum mesh. In another embodiment they each comprise aluminum foil coupled to an aluminum mesh. In yet another embodiment, layer 103 comprises an aluminum foil coupled to an aluminum mesh and layer 107 comprises a copper mesh.

The piezoelectric ultracapacitor portion 120 of FIG. 1 also includes electrolyte layers 104 and 106, which may comprise, for example, an organic or inorganic electrolyte, including for example an iodide electrolyte, a lithium-based electrolyte or an ionic liquid, or any of the electrolytes referred to above, any of which may be in a gelled, liquid or solid form. In some embodiments, layers 104 and 106 may also comprise a "carrier" material such as a felt or paper to hold the electrolyte in place. As noted in the above-referenced patent applications, one suitable electrolyte gel is Signa electrode gel, available from Parker Laboratories, Inc. of Fairfield, N.J. Another suitable electrolyte can be made from a solution of ethanol, LiCl and TiO2. In yet another embodiment, the electrolyte comprises polyvinyl alcohol mixed with acetic acid and LiCl.

Layer 105 of FIG. 1 is a layer of piezoelectric material formed of one or more portions of one or more suitable piezoelectric materials, such as polyvinylidene difluoride (also known as "PVDF") or flexible lead zirconate titanate (often referred to as "PZT"). The invention is not limited to the use of these materials, though it is believed that the flexible nature of these two piezoelectric materials provides some protection from cracking or other damage during use. Flexible piezoelectric materials are therefore preferred. Such materials are known and commercially available from many different sources. PVDF, for example, is available commercially under the trade names KYNAR® and KYNAR FLEX® by Arkema, Inc. of Philadelphia, Pa. Layer 105 may also include a conductive electrode on one or more faces of layer 105.

In the example of FIG. 1 the top face of piezoelectric layer 105 is electrically coupled to conductive layer 107. That is, the top face of piezoelectric layer 105 is coupled to the conductive layer opposite the lower face of piezoelectric layer 105. In the example of FIG. 1 this coupling is shown as a simple conductor 108, though other circuit elements may be used. An output from piezoelectric ultracapacitor portion 120 Vp, can be taken across layer 103 and the lower face of piezoelectric layer 105. Diode 109, though optional, provides assistance in ensuring the output voltage Vp is at a steady state.

As described in more detail in the above-referenced patent applications, a piezoelectric ultracapacitor will convert mechanical force or stress, including such minor forces as ordinary vibration, into a steady electric potential or voltage via the piezoelectric effect and its interaction with electrolyte and conductive layers. This characteristic of a piezoelectric ultracapacitor is employed advantageously in the context of the present invention in a new a novel way. In the example of FIG. 1, for example, the voltage from piezoelectric portion 120 is coupled to solar cell portion 110, via layer 103, thereby increasing the output of the solar cell portion 110. Specifically, the voltage generated by piezoelectric portion 120 creates an electric field in the semiconductor layer 102, making it easier for electrons to traverse the band gap of the semiconductor and to diffuse successfully to the appropriate electrode, thus increasing both the voltage and current produced by the solar cell portion 110.

Similarly, the output of the piezoelectric ultracapacitor portion 120 is also increased when coupled to the solar cell portion (and exposed to light). Specifically, the output voltage of the piezoelectric ultracapacitor is limited principally by the strength of the piezoelectric core, the characteristics of the electrolytes used and the specific electrode materials employed. Since one face of the core is coupled to a conductive layer opposite the other face of the core, voltages created by the piezoelectric, via the piezoelectric effect, cause ions in the electrolyte of a particular charge to collect at each interface in the system and ions of an opposite charge to collect at an opposite interface. This creates electric double layers within both layers of the electrolyte, one at the interface between the piezoelectric and the electrolyte and one at the interface between the conductive layer and the electrolyte. Thus, a steady output voltage can be detected between one face of the piezoelectric core and the electrode opposite the other face of the core.

However, these electric double layers in turn create a field in the piezoelectric core and in the conductive layers, causing a force on the piezoelectric via the reverse piezoelectric effect. The strength of that field is determined mainly by the concentration of ions of a particular charge collected at the interface. The combined effects caused by the piezoelectric effect and the reverse piezoelectric effect will balance each other out, however, permitting the output voltage to rise only to a certain extent and remain steady, the final steady state determined by the configuration of the piezoelectric ultracapacitor.

The operation of the solar cell portion 110 when it is coupled to the piezoelectric ultracapacitor portion 120, however, adds another variable to the equation, because the current passing through bottom electrode 101b, in this example, creates its own electric field which opposes or enhances, depending on the precise configuration of the device, the field created by the electric double layer in the electrolyte, and thereby permits the output voltage of the piezoelectric ultracapacitor portion to move to a different steady state level.

Moreover, the flexibility of the present invention permits a large number of different configurations. For example, in one embodiment the diode 109 in FIG. 1 may be reversed, so that its anode is connected to layer 105 and its cathode connected to layer 103. This will cause the polarity of the output voltage Vp to be reversed. This is useful because not every solar cell portion operates in the same manner. Similarly, in yet another embodiment piezoelectric ultracapacitor portion 120 may be "flipped" so that layer 107 becomes the "top" electrode coupled to solar cell portion 110. (The words "top" and "bottom" are used herein merely for explanatory purposes in view of the figures, and should not be interpreted to limit the invention to any particular physical configuration in practice.) In yet another embodiment piezoelectric ultracapacitor portion 120 may comprise an electrolyte and conductive layer opposite the top face of piezoelectric element 105 but not opposite the bottom face of element 105. Further, while FIG. 1 depicts a single piezoelectric ultracapacitive solar cell, multiple such cells may be coupled to together, either in parallel or series, to form an array of piezoelectric ultracapacitive solar cells.

Figure 2:
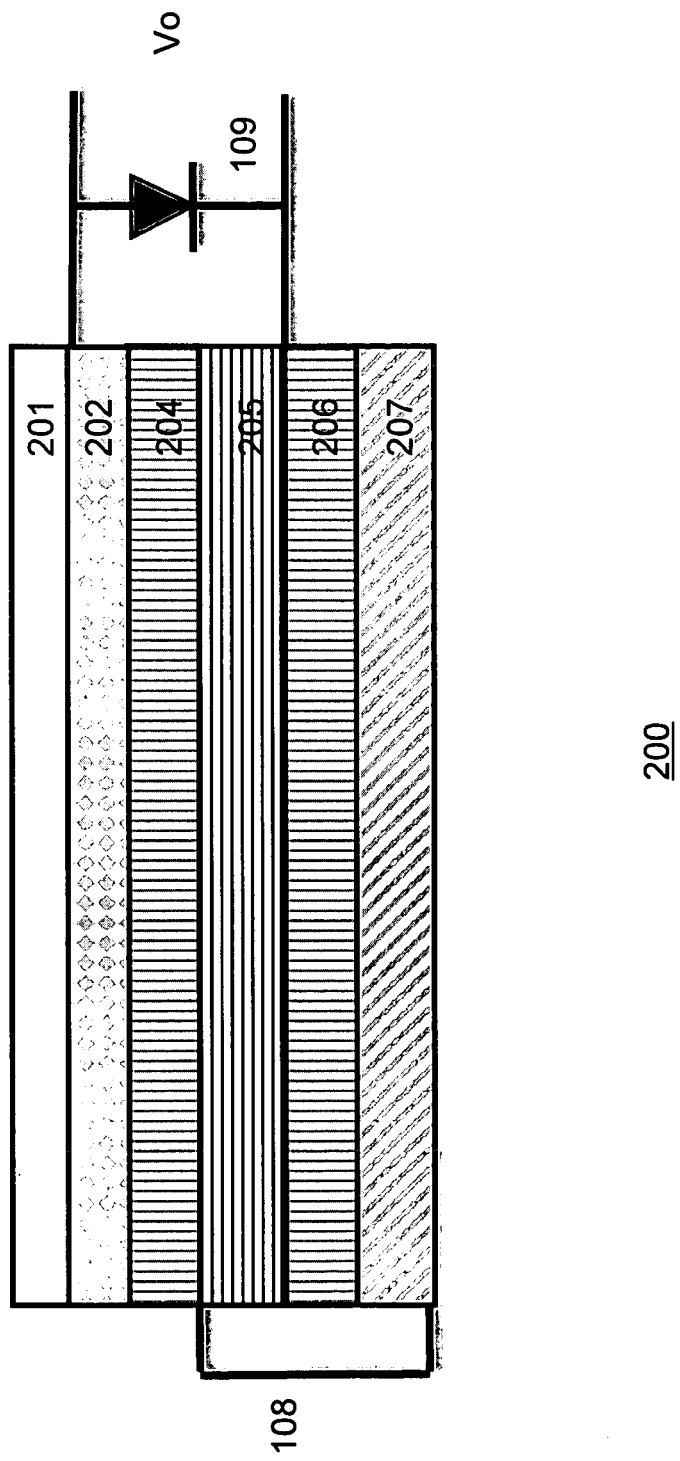
FIG. 2 depicts a second embodiment of a piezoelectric ultracapacitive photovoltaic cell employing the principles of the present invention.

Referring to FIG. 2, there is depicted a second example of a piezoelectric ultracapacitive photovoltaic cell 200 employing the principles of the present invention. In cell 200, layers 201 through 207 are similar to layers 101 through 107, respectively, as described with respect to the embodiment of FIG. 1. Layer 201, for example, can comprise the same materials as layer 101a described above and layer 202 may comprise the same materials as layer 102a described above. Similarly, layers 204 through 207 may comprise the same materials as layers 104 through 107, respectively, described above. However, in the example of cell 200 of FIG. 2 there is a single electrolyte layer 204 and no conductive layer between semiconductor layer 202 and piezoelectric layer 205. This embodiment is therefore much simpler and less expensive to construct, while still employing the principles of the invention.

I claim:

1. A piezoelectric photovoltaic cell comprising a photoelectric layer coupled to a layer of piezoelectric material, wherein said layer of piezoelectric material has a first surface and a second surface opposite said first surface and wherein said first surface of said layer of piezoelectric material is in direct contact with a first electrolyte layer and said second surface of said layer of piezoelectric material is in direct contact with a second electrolyte layer, wherein the second electrolyte layer is separate from said first electrolyte layer.

2. The piezoelectric photovoltaic cell of claim 1, further comprising a first semiconductor material of a first type and a second semiconductor material of a second type.

3. The piezoelectric photovoltaic cell of claim 1, wherein said layer of piezoelectric material is coupled to at least one semiconductor layer.

4. The piezoelectric photovoltaic cell of claim 1, comprising a conductive polymer.

5. The piezoelectric photovoltaic cell of claim 1, wherein said first surface is coupled to an electrode opposite said second surface.

6. The piezoelectric photovoltaic cell of claim 1, further comprising a first semiconductor material.

7. The piezoelectric photovoltaic cell of claim 6, wherein said first semiconductor material is to at least one means for conducting.

8. The piezoelectric photovoltaic cell of claim 6, wherein said first semiconductor material is dye sensitized.

9. An apparatus comprising a layer of piezoelectric material having a first surface and a second surface opposite said first surface and coupled to a photovoltaic device, wherein said first surface of said layer of piezoelectric material is in direct contact with a first electrolyte layer and said second surface of said layer of piezoelectric material is in direct contact with a second electrolyte layer and wherein said first surface is coupled to an electrode opposite said second surface.

10. The apparatus of claim 9, wherein said photovoltaic device comprises a dye sensitized solar cell.

11. The apparatus of claim 9, wherein said photovoltaic device comprises a flexible substrate.

12. The apparatus of claim 9, wherein said photovoltaic device comprises a conductive polymer.

13. The apparatus of claim 9, wherein said first electrolyte layer is distinct from said second electrolyte layer.

14. A device comprising means for converting light to electric current coupled to means for converting mechanical stress to electric potential, wherein said means for converting mechanical stress to electric potential comprises a first surface and a second surface opposite said first surface, wherein said first surface is in direct contact with a first electrolyte layer and said second surface is in direct contact with a second electrolyte layer, and wherein said first surface is coupled to an electrode opposite said second surface.

15. The device of claim 14, wherein the means for converting light comprises a dye sensitized solar cell.

16. The device of claim 14, wherein the means for converting mechanical stress comprises a piezoelectric ultracapacitor.

\* \* \* \* \*